United States Patent [19]

Kirstein

[11] Patent Number: 4,661,772

[45] Date of Patent: Apr. 28, 1987

[54] MEASURING AND TESTING CIRCUIT

[75] Inventor: Gerhard Kirstein, Augsburg, Fed. Rep. of Germany

[73] Assignee: Zahnraderfabrik Renk AG, Fed. Rep. of Germany

[21] Appl. No.: 691,124

[22] Filed: Jan. 14, 1985

[30] Foreign Application Priority Data

Feb. 15, 1984 [DE] Fed. Rep. of Germany ....... 3405289

[51] Int. Cl.$^4$ .......................................... G01R 31/02
[52] U.S. Cl. ...................... 324/158 R; 324/158 MG; 324/73 PC
[58] Field of Search ........... 324/158 MG, 158 R, 110, 324/160, 73 PC; 364/550, 551; 318/490

[56] References Cited

U.S. PATENT DOCUMENTS

| 3,527,954 | 9/1970 | Hoffman | 324/158 MG |
| 3,639,837 | 2/1972 | Masel et al. | 324/158 R |
| 3,953,797 | 4/1976 | Berard et al. | 324/73 PC |

FOREIGN PATENT DOCUMENTS

| 0053786 | 6/1982 | European Pat. Off. | |
| 143663 | 9/1980 | Fed. Rep. of Germany | |
| 3123265 | 6/1981 | Fed. Rep. of Germany | |
| 0208478 | 12/1982 | Japan | 324/158 MG |

OTHER PUBLICATIONS

"Load Simulation System for Testing Medium and Small Motors", by Villanueva, *Electronica Industrial*, 6/80, 324–158 MG.

Primary Examiner—Reinhard J. Eisenzopf
Assistant Examiner—W. Burns
Attorney, Agent, or Firm—Larson and Taylor

[57] ABSTRACT

A measuring and testing circuit for electric components including a microcomputer is provided. The circuit is for electronically controlled devices, especially gearings, which include electric components. The circuit includes at least one measuring branch and at least one testing branch for each electric component to be monitored. Each measuring branch is connected through a capacitor to a test contact for the component to be monitored. The testing branch also connects a rate signal output from the microcomputer with a test contact. Thus, with low circuit outlay, measurements of the components to be monitored can be detected and measured continually, or else only during measuring phase pauses when the components to be monitored and also the measuring branches are monitored for operational capability.

4 Claims, 1 Drawing Figure

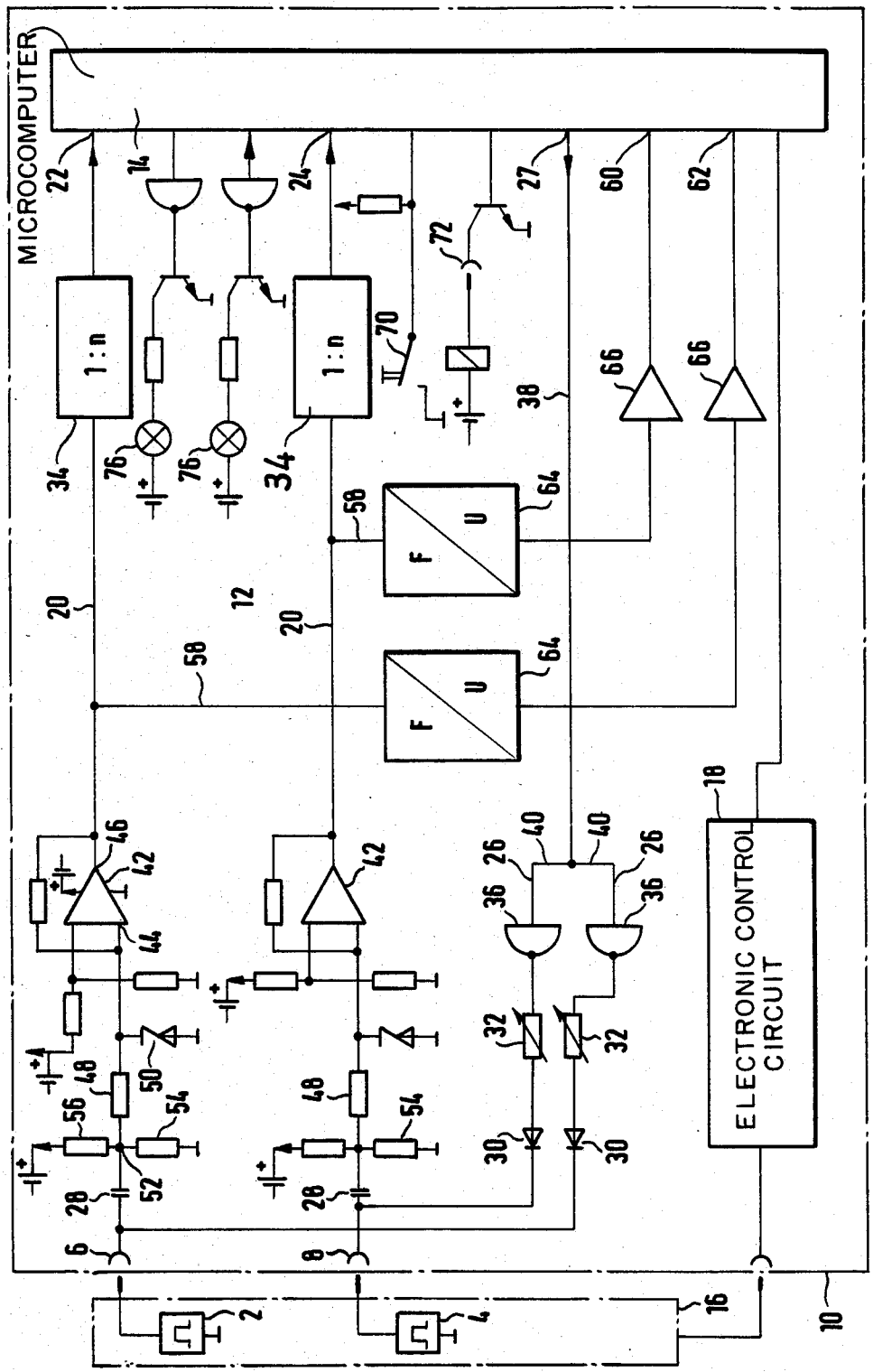

MEASURING AND TESTING CIRCUIT

FIELD OF THE INVENTION

The invention relates to a measuring and testing circuit with a microcomputer for electric components of electronically controlled devices, particularly gearings, with at least one measuring branch which connects a contact of the microcomputer with a test contact.

SUMMARY OF THE INVENTION

The measuring and testing circuit preferably serves for measurement electrical data of electric components in electronic devices of gearings. Measuring procedures can be carried out while the gearing is at a standstill and also while it is in operation. Testing of the electric components for defects advantageously occurs only when the gearing is stopped, but, dependent on the program of the microcomputer, can also occcur during operation. In a preferred embodiment, the detection of measured values is interrupted when the operational capability of the electric component is being tested. According to the program of the microcomputer, however, measured values and test values can also be picked up simultaneously.

Electrically controlled devices could include: automatic gearing, turbines, transmission assemblies, machine tools.

Electric components which are measured and tested could include: resistances, coils, capacitances, complex resistances.

Measuring procedures can be: measurement of speed, temperature, pressure.

Testing procedures can be: testing of inductive transmitters and testing of magnetic valves for operational capability.

The electric components which are to be measured and examined are indicated hereinafter as "components to be monitored".

The invention provides the measurement not only of the operation of the components to be monitored, but, with a simple outlay, also the operational capability of these components. The circuit will not be costly; the operational capability of the circuit, however, is to be very reliable.

The object of the invention is attained in that the measuring branch is connected through a capacitor to the contact, that at least one testing branch is provided which connects a rate signal output for the microcomputer with the test contact and contains a diode switched in a transmission direction to the test contact, and in that the microcomputer transmits no rate signals to the testing branch during the measuring phase.

During the measuring phase, operational data of the component to be monitored is determined through the measuring branch. For the testing phase, both the testing branch and the measuring branch are used for processing data between the microcomputer and the component to be monitored. By using the measuring branch also during the testing phase, only a low additional circuit outlay for the testing phase is required, in the form of the testing branch. A very reliable operation is obtained nonetheless, because the measuring branch works for the detection of the operational data independent of the testing branch. If a defect of the component to be monitored is detected in the testing phase by the microcomputer, then the electronically controlled device can be switched off, blocked or controlled in some other manner by an emergency program. A similar auxiliary program can be started up from the computer for a defect in the testing branch.

Other features of the invention are included in the dependent claims.

BRIEF DESCRIPTION OF THE DRAWING

One exemplary embodiment of the invention is described hereinafter with reference to the schematic drawing.

DETAILED DESCRIPTION OF THE PREFERRED EMBODIMENTS

The drawing shows two electric components 2 and 4 to be monitored. More components could also be portrayed. As an example, it is assumed that these components 2 and 4 are inductive sensors, which transmit an electric pulse to an electric test contact 6 or 8 of the circuit to be described hereinafter, at each passage of a tooth of a gearwheel.

The drawing shows a printed circuit board 10 in dot-dash line. A measuring and testing circuit 12 is provided with a microcomputer 14 for the detection of measured values and for the testing of the components 2 and 4 to be monitored. Components 2 and 4 are electronic components of an electronically controlled gearing 16, which is shown only diagrammatically in the drawing by a dot-dash line. Furthermore, an electronic control 18 is found on printed circuit board 10 which is attached to microcomputer 14 and to electronic gearing components 16. Electronic control 18 can cause engagement and disengagement of meshing of gearing 16, and also the circuits of movement, and the engagement and disengagement of torque converters and of other devices of gearing 16.

The measuring and testing circuit includes two identically constructed measuring branches 20, of which the one connects a contact 22 of microcomputer 14 with the one test contact 6 and the other connects another contact 24 of the microcomputer with the other test contact 8. Microcomputer 14 has a rate signal output 27 which is connected through a testing branch 26 with the one test contact 6 and through an identically constructed second testing branch with the other test contact 8. Each measuring branch 20 is connected through a capacitor 28 of e.g. 0.22 microF to the test contacts 6 and 8. In each testing branch 26 is found a diode 30 connected in the transmission direction to the test contact 6 or 8, and preferably an adjustable electric resistance 32 of e.g. 4.7 kilo-ohms in series with the diode. The electric resistance 32 and the diode 30, together with the electric resistance of component 2 or 4 to be monitored, form a voltage divider of which the pick-up is the test contact 6 or 8.

The dynamic state of gearing 16 is the state in which the gearwheels revolve. The static state is therefore the state in which the gearwheels of the gearing stand still. The measured data of the components to be monitored are normally measured only when the gearing is in the dynamic state. During the measuring phase, microcomputer 14 transmits no rate signals to testing branch 26, so that testing branches 26 are not active. Pulse signals of components 2 and 4 to be monitored are blocked by diodes 30 and thus cannot get through testing branches 26 of the rate signal output 27 of microcomputer 14. The pulse signals of components 2 and 4 to be monitored, however, change the capacitors 28 of measuring branch 20. Thus, each capacitor 28 transmits a pulse signal to measuring branch 20 corresponding to the pulse signal of the relevant component 2 or 4 to be monitored, and from there through a pulse divider 34, which reduces the pulse sequence, to the relevant contact 22 or 24 microcomputer 14.

Components 2 and 4 to be monitored are tested for operational capability advantageously only when the gearing is at a standstill, because then the rate signal outputs 27 of microcomputer 14 are not transmitted with pulses from the components to be monitored. The rate signal outputs 27 pass over diode 30 of the relevant testing branch 26 to the relevant test contact 6 or 8, and there cause capacitor 28 to be charged, dependent upon the electric resistance of component 2 or 4 to be monitored. Capacitor 28 is discharged in the pauses of the pulse signals of output 26 from the microcomputer dependent upon the electric resistance of the component 2 or 4 to be monitored. Capacitor 28, dependent upon this charging and discharging, gives corresponding signals through measuring branch 20 to the input 22 or 24 of microcomputer 14. Microcomputer 14 determines from these signals whether component 2 or 4 is defective.

An interruption of the electric connection between test contact 6 or 8 and component 2 or 4 to be monitored corresponds to an infinitely great resistance. A brief contact in the connection corresponds to a "zero" resistance. In either case, the circuit can recognize the defect.

A buffer circuit 36 is found in each of the two testing branches 26. They prevent signals from test contacts 6 and 8 of the testing branch from getting into the other testing branch or through a line 38 to the rate signal output 27 of microcomputer 14. Line 38 connects the ends 40 of testing branch 26 turned toward microcomputer 14 with rate signal output 27.

A Schmitt trigger circuit 42 on the side toward contact 22 of microcomputer 14 is found in each measuring branch in series with capacitor 28. The pulse divider 34 is connected in series between Schmitt trigger circuit 42 and microcomputer contact 22. Schmitt trigger circuit 42 causes low value variations of the signals given from capacitor 28 to its input 44 to refrain from varying the signal fed to microcomputer contact 22. Schmitt trigger circuit 42 transmits to its output 46 at any time only one of two state signals at the microcomputer contact 22. The one state signal is displayed at output 46 when the signal at input 44 has reached a certain lowest magnitude. The other state signal is displayed at output 46 when the input signal at input 44 has dropped to a certain lowest level. Intermediate values of the input signal at input 44 of Schmitt trigger circuit 42 result in no change of the state signal at its output 46. Thus, during small changes of the input signal to output 44, the signal at output 46 avoids continuous oscillation back and forth between the values of the two signals.

A resistance 48 connected in series with capacitor 28 and input 44, together with a Zener diode 50, serves in a customary manner with electric circuits as an overvoltage protection circuit. Between resistance 48 and capacitor 28 is found the pick-up 52 of two resistances 54 and 56, which form a voltage divider.

As shown in the drawing, a monitoring branch is connected to each measuring branch 20, preferably at the output 46 of Schmitt trigger circuit 42, which connects measuring branch 20 with a measuring contact 60 or 62 on microcomputer 14. Each monitoring branch 58 includes a frequency-voltage converter 64 and a series-connected Schmitt trigger circuit 66 in series, connected on the side toward microcomputer 14. Frequency-voltage converters 64 alter a pulse signal obtained from the associated measuring branch 20 into an analog signal in the form of an electric voltage. Microcomputer 14 can thus determine through the signals to these measuring contacts 60 and 62 whether gearing 16 is found in the dynamic or static state. Dependent upon that, then, a measuring phase or a testing phase or a certain program for the control device 18 can be started up from microcomputer 14.

A testing key 70 of microcomputer 14 for sorting a testing phase for testing of component 2 or 4 to be monitored, a signal output 72 from microcomputer 14 from which to tell whether a testing phase has run out by a certain electric signal and also for each component 2 and 4 to be monitored, and a defect indicator light 76 are found on printed circuit board 10. Defect indicator lights 76 are controlled from microcomputer 14, dependent upon defect indicator signals from testing branch 26.

The application of all of the cited parts on printed circuit board 10 allows for short electric cable and lines and a compact total structure.

I claim:

1. A measuring and testing circuit for an electric component of an electrically controlled device, such as a gearing, said electrical component producing pulse signals indicative of operational data of the device having a test contact, said circuit comprising:

a microcomputer including a contact and a rate signal output which is supplied only during a testing phase of the circuit;

a measuring branch which connects said contact of said microcomputer to the test contact for measurement of the operational data of the electric component;

a capacitor through which said measuring branch is connected to the test contact, said capacitor transmitting pulse signals indicative of the electric compont;

a Schmitt trigger circuit in said measuring branch connected in series with said capacitor and located on a side toward said contact of said microcomputer;

a testing branch which connects said rate signal output with the test contact and which is connected to said microcomputer through said capacitor and said measuring branch, said testing branch including a diode connected in a transmission direction to the test contact; and a monitoring branch for determining a dynyamic or static state of the controlled device, said monitoring branch containing a frequency/voltage converter for digitizing pulse signals, an input to said measuring branch located between said capacitor which transmits pulse signals and an input of said measuring branch to said microcomputer, and an output connected to an additional contact of said microcomputer such that depending upon the digitized signals from said monitoring branch said microcomputer determines whether the controlled device is in the dynamic state and activates said testing branch.

2. A measuring and testing circuit as claimed in claim 1 and further including an adjustable electric resistance in series with said diode of said testing branch whereby said electric resistance together with the electrical resistance of the electric component to be measured form a voltage divider whose pick-up is the test contact.

3. A measuring and testing circuit as claimed in claim 1 and further including;
- a testing circuit for sorting test results of said measuring branch including a test key for activating said testing circuit, an output for said testing circuit such that a certain signal is produced at said testing circuit output where a testing of the electric component by said testing branch is taking place and said test key is in an activated position, and an indicator light which is actuated when the certain signal is produced;
- an electronic control circuit for the electrically controlled device; and
- a common printed circuit board on which said test key, said output for said testing circuit, said indicator light, said microcomputer, said electronic control, and the electric component are located.

4. A measuring and testing circuit for an electric component of an electrically controlled device, such as a gearing, said electric component producing pulse signals indicative of operational data of the device having a test contact, said circuit comprising:
- a microcomputer including a contact and a rate signal output which is supplied only during a testing phase of the circuit;
- a measuring branch which connects said contact of said microcomputer to the test contact for measurement of the operational data of the electric component;
- a capacitor through which said measuring branch is connected to the test contact, said capacitor transmitting pulse signals indicative of the electric component;
- a testing branch which connects said rate signal output with the test contact and which is connected to said microcomputer through said capacitor and said measuring branch, said testing branch including a diode connected in a transmission direction to the test contact;
- an adjustable electric resistance in series with said diode of said testing branch whereby said electric resistance together with the electrical resistance of the electrical component to be monitored form a voltage divider whose pick-up is the test contact;
- a Schmitt trigger circuit in said measuring branch connected in series with said capacitor and located on a side toward said contact of said microcomputer;
- a monitoring branch for determining a dynamic state of the controlled device, said monitoring branch containing a frequency/voltage converter for digitizing pulse signals, an input to said measuring branch located between said capacitor which transmits pulse signals and an input of said measuring branch to said microcomputer, and an output connected to an additional contact of said microcomputer such that depending upon the digitized signals from said monitoring branch said microcomputer determines whether the controlled device is in the dynamic state and activates said testing branch;
- a testing circuit for sorting test results of said measuring branch from the operational data of the electric component including a test key for activating said testing circuit, an output for said testing circuit such that a certain signal is produced at said testing circuit output where a testing of the electric component by said testing branch is taking place and said test key is in an activated position, and an indicator light which is activated when the certain signal is produced;
- an electronic control circuit for the electrically controlled device; and
- a common printed circuit board on which said test key, said output for said testing circuit, said indicator light, said microcomputer, said electronic control, and the electric component are located.

* * * * *